United States Patent [19]

Fraser

[11] 4,022,930
[45] May 10, 1977

[54] MULTILEVEL METALLIZATION FOR INTEGRATED CIRCUITS

[75] Inventor: David Bruce Fraser, Berkeley Heights, N.J.

[73] Assignee: Bell Telephone Laboratories, Incorporated, Murray Hill, N.J.

[22] Filed: May 30, 1975

[21] Appl. No.: 582,142

[52] U.S. Cl. .................. 427/86; 156/665; 156/659; 156/656; 156/657; 427/88; 427/90; 427/91; 427/93; 427/96; 427/99

[51] Int. Cl.² .................................. B05D 5/12

[58] Field of Search .................. 427/90, 86, 93, 96, 427/88, 91, 99; 156/22, 17, 7; 29/591

[56] References Cited

UNITED STATES PATENTS

| | | | |
|---|---|---|---|
| 3,413,157 | 11/1968 | Kuiper | 427/90 |
| 3,579,375 | 5/1971 | Wonilowicz et al. | 427/90 |
| 3,620,837 | 11/1971 | Leff et al. | 427/93 |
| 3,672,983 | 6/1972 | DeWitt et al. | 427/90 |
| 3,801,477 | 4/1974 | Ronen et al. | 427/93 |
| 3,806,361 | 4/1974 | Lehner | 427/86 |
| 3,825,454 | 7/1974 | Kikuchi et al. | 156/17 |
| 3,855,112 | 12/1974 | Tomozawa et al. | 156/17 |
| 3,909,925 | 10/1975 | Forbes et al. | 29/591 |

*Primary Examiner*—Cameron K. Weiffenbach
*Attorney, Agent, or Firm*—Peter V. D. Wilde

[57] ABSTRACT

The specification describes a procedure for multilevel metallization of semiconductor integrated circuits in which the severity of the step formed by the edges of the first level pattern and the intermediate insulator over which the second level metallization pattern extends is reduced by beveling the edge. The bevel occurs during selective etching of the first level metal as a consequence of depositing the first level metal over a range of diminishing temperatures. Metal layers, notably aluminum, deposited in this way exhibit a differential etch rate such that the layer etches more slowly as etching proceeds through the thickness of the layer. Bevels of the order of 30° to the horizontal can be produced in this way.

4 Claims, 2 Drawing Figures

MULTILEVEL METALLIZATION FOR INTEGRATED CIRCUITS

FIELD OF THE INVENTION

This invention relates to multilevel metallization procedures used in the manufacture of semiconductor integrated circuits.

BACKGROUND OF THE INVENTION

One of the formidable problems in multilevel metallization of integrated circuits is obtaining continuity of the second level metal over the step formed by the dielectric coated first level metal pattern. The problem arises from the difficulty in maintaining an adequately thick metal layer as it traverses the step. Moreover, during the metal deposition process voids tend to develop at a strip step edge. These voids trap etchants and other processing fluids causing corrosion and contamination of the device.

These problems are well known in the integrated circuit industry. To avoid them it is desirable to deposit the metal layer in such a manner that shallow bevel angles result at any step edge that is subsequently to be covered.

It can be mentioned at the outset that these metallization patterns are typically formed of aluminum. This description will deal primarily with aluminum metallization although it will be recognized that the teachings described may as effectively be applied to other metallurgical systems. It is known that when aluminum is deposited on silicon, typically for contacts, the silicon is soluble in aluminum sufficiently to pit the silicon. This is unacceptable in many cases, for example, if the device has shallow junctions. An Al—Si alloy (1–2% Si) is used to avoid this problem. The ensuing description is as applicable to the alloy as to aluminum. It is also applicable to polysilicon metallization.

Processing parameters and reliability of two level aluminum metallization structures have been investigated by P. B. Ghate, et al., *IEEE Trans. on Reliability*, Vol. R22, 186 (1973). Their technique to bevel the aluminum is to standardize photoresist operations and optimize the etch temperature. No quantitative description of the bevel angle is given. T. Agatsuma et al., Meeting of the Electrochemical Society, May 1973, have recently reported an aluminum beveling procedure which utilizes a differential etch rate technique on anodized aluminum. Bevel angle obtained by this differential etching varied from 6° to 45°.

BRIEF DESCRIPTION OF INVENTION

According to this invention desirable beveling of the first layer of metallization is obtained by depositing the metal over a range of decreasing temperatures. This is conveniently done by initially heating the substrate, then cooling the substrate as deposition proceeds. The result is a metal layer that etches fast at the surface and more slowly as etching proceeds through the layer thickness. A variable etch rate also can be achieved following these teachings by adjusting stepwise the temperature of the deposition as it proceeds. It would even prove useful to deposit simply at two different temperatures.

DETAILED DESCRIPTION OF THE INVENTION

Figure 1:
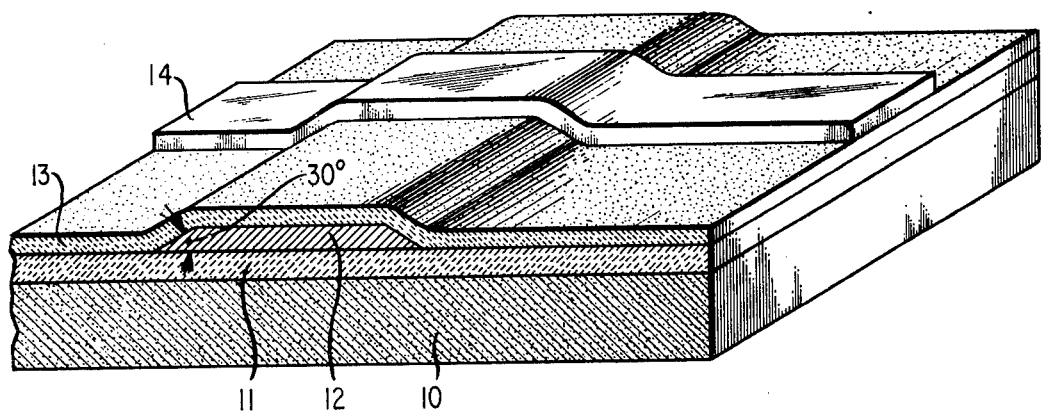
FIG. 1 is a perspective view partly in section of a portion of an integrated circuit showing a two level metallization pattern with a bevel at the edge of the first level pattern.

A silicon integrated logic circuit wafer was used to demonstrate the procedure of the invention. The devices on the wafer utilize a two layer metallization with a first level metal thickness of 7800 A separated by an intermediate deposited $SiO_2$ layer of 13,000 A thickness from a second level metal layer of 20,000 A thickness. Both first and second level metal layers are Al—Si alloys.

The metal films were deposited on device wafers with thermally grown oxide layers about 6000 A thick. The system used for deposition was ion pumped and utilized double e-guns for co-evaporation of aluminum and silicon. The chamber of the evaporator was equipped with planetary substrate holders and tungsten halogen substrate heaters.

The films were co-evaporated Al—Si alloys with silicon content ranging from 1–2 weight percent. Deposition of first level metal was initiated on substrates that had been preheated to 325° C. As soon as film deposition commenced the radiant heaters were turned off and the substrates were allowed to cool. A deposition rate of 60 A/sec was used and final film thickness was in the range 7500–8000 A. Second level Al—Si was deposited on substrates that were heated continuously throughout the deposition. A maximum substrate temperature of 325° C was used. A deposition rate of 60 A/sec was used and film thickness ranged from 17,500–25,000 A. The system was allowed to cool to 100° C before venting. Aluminum of 99.999 percent purity was used as the source of Al deposition. The silicon source was from an ingot whose resistivity $\geq 10,000$ Ω-cm.

The Al—Si films were patterned using Waycoat IC-3, 43 cps negative resist. Generally, the Al—Si films were air baked prior to deposition of the photoresist. A few, however, were heated under vacuum at 150° C for 30 minutes. No differences were observed in photoresist adherence between films which were air or vacuum baked before coating with photoresist. A plasma cleaning step was used prior to photoresist application. A nominal 10,000 A thickness of photoresist was used. After exposure, development and a vacuum post-bake at 150° C for 30 minutes, the resultant resist pattern was 7500–8500 A in thickness. To ensure complete cleaning of the photoresist from the pattern areas to be etched a one minute exposure at 100 W in a plasma stripper was used on several samples after the post-bake.

The masked wafer was etched using a fountain etching procedure. In fountain etching the etchant is circulated forcibly by a pump and is the etching analogue of the velocity or fountain plating technique sometimes used for gold plating. Such fountain etching minimizes bubble retention and provides uniform etching across the wafer.

The fountain etching was first performed in a system fabricated with a magnetically coupled, centrifugal pump, Tygon tubing, a Pyrex funnel and a Teflon beaker. Heat was supplied by the pump and the solution temperature was about 50° C. Unfortunately, the use of $NH_4F$ subjected the glass and the pump to chemical attack and resulted in a continuously changing F⁻ ion concentration. However, the system was useful in that it provided evidence of the merit of this method for obtaining sloped edges. The composition of the etchant mixture used was:

76 ml phosphoric acid (85%)
15 ml glacial acetic acid
3 ml conc. nitric acid
5 ml water
2 ml NH$_4$F (40%) for the fluoride option
4 drops of 0.1% Triton X-100.

For first level metal Al-Si layers the etch rate ranged from 2600 A per minute to 3100 A per minute.

The resulting etched structures showed first level metallization patterns with edges exhibiting bevel angles of the order of 30° to the horizontal. After etching the patterned first level metallization is coated with an insulating layer, typically, SiO$_2$. This layer may be grown by techniques well known in the art. However, it is apparent that the step at the edges of the pattern will be somewhat less severe if the oxide is deposited over the entire surface. In some cases it may be advantageous to use a combination of deposition and growing procedures to insure complete coverage. That is, an oxide layer can first be deposited by chemical vapor deposition and subsequently exposed to a thermal oxide step during which any bare metal or metal inadequately covered will be thermally oxidized. In the procedures described here the first level metallization was coated with 1.4μm of SiO$_2$ deposited by a standard chemical vapor deposition process. A second level metallization pattern is then deposited over the oxide layer in essentially the same way described for the first level, the second metal layer is patterned as before.

The structure at this stage in the processing is shown in FIG. 1. A silicon substrate 10 is covered with the first insulating layer 11, typically SiO$_2$. The first level metallization pattern 12 appears in section covered with the deposited oxide layer 13. A portion of the second level metallization pattern, that is, a strip extending orthogonal to a strip of the first pattern, appears at 14. The bevel at the edge of metallization 12 shows an angle of 30° to the horizontal. The structure, now with two metallization levels, can be processed in a similar manner to incorporate additional metal levels or can be finished, that is, passivated and encapsulated in a conventional way.

Figure 2:
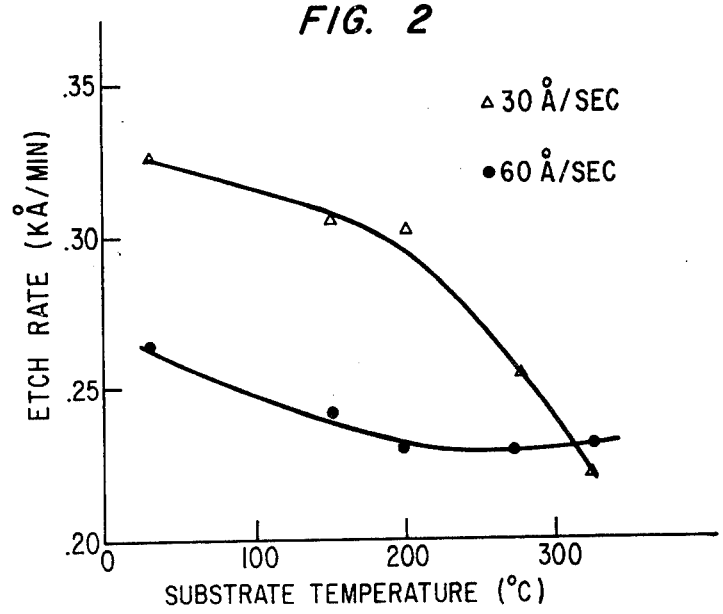
FIG. 2 is a plot of metal etch rate versus temperature of deposition to demonstrate a major aspect of the metallization procedure of the invention.

In order to establish more clearly the effect of cooling during deposition of the first level metallization, a series of oxidized silicon substrates with metal deposited at various temperatures (150°, 200°, 275°, 325° and room temperature) were etched to determine the actual variation in metal etch rate. The resulting data are presented in FIG. 2 where the etch rate in μm per minute is plotted as ordinate against the substrate temperature, during deposition. Two curves are presented giving data for two different metal deposition rates.

Although the metal used in the procedures described here was the aforementioned aluminum silicon alloy it should be clear that similar effects are produced in pure aluminum metallization patterns and in other metallurgical systems notably polysilicon. The effects observed are believed to be due to variations in crystalline structure, in particular variations in the concentration of vacancies, and therefore are obtainable with a variety of metals and alloys.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A method for producing multilevel metallization on a semiconductor substrate comprising,
    forming an insulating layer on the semiconductor wafer,
    forming an Al, Si or Al—Si metal layer over the insulating layer by depositing the metal while simultaneously decreasing the temperature of the semiconductor wafer, applying an etch resist pattern to the metal layer, and chemically etching away the regions of the metal layer exposed through the etch resist pattern to form a first level metallization pattern having beveled edges,
    forming a second insulating layer over the first level metallization pattern,
    forming a second level metallization pattern on the second insulating layer.

2. The method of claim 2 in which the wafer is silicon and the metal is aluminum or an aluminum-silicon alloy.

3. The method of claim 1 in which the wafer is silicon and the metal is polysilicon.

4. The method of claim 1 in which the decreasing temperature range extends between approximately 350° and room temperature.

* * * * *